(12) United States Patent
Oberhuber

(10) Patent No.: US 7,541,872 B2
(45) Date of Patent: Jun. 2, 2009

(54) STARTUP CIRCUIT FOR SUBREGULATED AMPLIFIER

(75) Inventor: Ralph Oberhuber, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/962,296

(22) Filed: Dec. 21, 2007

(65) Prior Publication Data
US 2009/0015332 A1    Jan. 15, 2009

Related U.S. Application Data (60) Provisional application No. 60/948,622, filed on Jul. 9, 2007.

(51) Int. Cl.
*H03F 3/45* (2006.01)
(52) U.S. Cl. .................. 330/261; 330/257; 330/297; 330/296
(58) Field of Classification Search .............. 330/261, 330/257, 297, 296
See application file for complete search history.

(56) References Cited

U.S. PATENT DOCUMENTS

| | | | | |
|---|---|---|---|---|
| 4,160,201 A | * | 7/1979 | Ahmed ...................... 323/226 |
| 5,714,906 A | * | 2/1998 | Motamed et al. ............ 327/563 |
| 7,061,337 B2 | * | 6/2006 | Partovi et al. ............... 331/109 |
| 7,463,068 B2 | * | 12/2008 | Lee et al. ..................... 326/115 |
| 2008/0089533 A1 | * | 4/2008 | Theus et al. ............... 381/94.5 |

* cited by examiner

*Primary Examiner*—Patricia Nguyen
(74) *Attorney, Agent, or Firm*—John J. Patti; Wade J. Brady, III; Frederick J. Telecky, Jr.

(57) ABSTRACT

A multi-stage circuit has a first stage powered by the output voltage of a next stage. A current source within the first stage provides a tail current for a differential amplifier within the first stage. When the first stage has an operating voltage high enough for proper operation, this tail current is at a nominal level; if the voltage is too low for proper operation of the first stage, the tail current is below this nominal level. A comparator, which has one input coupled to a node within this current source, a second input coupled to a threshold voltage, and an output coupled to a control node within the next stage, provides an output indicative of whether or not the tail current is substantially at its nominal level. If tail current is too low, the comparator provides a forcing signal to the control node of the next stage which causes the output of the next stage to be at a substantially nominal level regardless of the voltage at its input, thus providing a suitably high voltage for the first stage to begin normal operation. When the tail current reaches its nominal level, the comparator output changes state to one which has little or no effect on the output voltage of the second stage, and normal operation of the overall circuit begins.

9 Claims, 4 Drawing Sheets

STARTUP CIRCUIT FOR SUBREGULATED AMPLIFIER

BACKGROUND OF THE INVENTION

1. Field of the Invention

This invention relates generally to startup circuits, which temporarily provide, or cause to be provided, a suitable startup operating voltage for a first subcircuit during the time immediately following application of power to the overall circuit, whereby another subcircuit coupled to and dependent on operation of the first subcircuit may become fully operational and stable prior to removal of the startup voltage; and more specifically to a startup circuit used in a bandgap voltage reference circuit in which the output node of the output stage is coupled to the preceding bandgap circuit and first stage amplifier, thereby improving power supply rejection ratio (PSRR) of the overall circuit.

2. Description of the Related Art

Many electronic circuits are powered by a power supply external to the circuit, thereby causing some operational parameters of the circuit to be dependent on the characteristics of the voltage or current provided by the external power supply. In this document, the voltage and current provided by this external supply are referred to as AVDD, and are typically coupled to circuit terminals also labeled AVDD. An example of one such circuit is a high-gain amplifier, which typically has multiple cascaded gain stages to provide the desired overall gain. It is desirable for the first stage (or stages) of such an amplifier to be powered by a supply voltage having low levels of superimposed noise and ripple, since many typical amplifier stages couple some of this power supply noise to the amplifier output. A known figure of merit for an amplifier is power supply rejection ratio (PSRR), which is a measure of the isolation between the power supply input of the amplifier and the amplifier output. PSRR is also commonly used as a figure of merit for many other circuit types, such as voltage references, voltage regulators, and others.

One known approach to improving PSRR is the use of a subregulated supply. A voltage regulator with its input coupled to the overall supply voltage AVDD is used to produce a subregulated voltage, typically lower than AVDD and quieter than AVDD. A low-noise preamplifier is an example of a circuit which might benefit from a subregulated supply for some or all of the gain stages to increase PSRR.

Another circuit type which benefits from high PSRR is a voltage reference. A high PSRR is desired to keep fluctuations and noise on AVDD from coupling to the output of the voltage reference. A typical voltage reference has a bandgap internal reference voltage generator followed by a buffer amplifier to increase the internal reference voltage to the desired output reference voltage, and to provide a low output impedance. If the bandgap internal reference voltage generator is powered by AVDD, noise on AVDD which is coupled to the internal reference voltage is then amplified and coupled to the voltage reference output. If the bandgap internal reference voltage generator is instead powered by a subregulated supply, PSRR may be dramatically improved. The output of the voltage reference may be used as the subregulated supply voltage for preceding stages such as the bandgap internal reference voltage generator, since the output voltage by design is typically very stable.

However, when the bandgap subcircuit is powered by its own amplified and buffered voltage, startup may not occur reliably or at all. If a stable state exists where the output voltage is lower than the voltage required by the bandgap subcircuit to operate, proper startup may not occur. To preclude such startup problems, a startup subcircuit may provide temporary power to the bandgap subcircuit until internal voltages stabilize at desired levels, after which the startup subcircuit may be electronically removed from the overall circuit.

Known startup circuits apply the AVDD voltage temporarily to subcircuits which, after startup, are powered by a quieter internally generated subregulated voltage. The duration of the application of AVDD may be controlled by a time delay or by the crossing of some threshold by an internal circuit parameter.

An apparatus and method for reliable startup of a circuit using a subregulated supply, having both reliable operation and simple topology, is therefore desirable and is an object of the present invention.

SUMMARY OF THE INVENTION

The invention provides a method and apparatus for temporarily providing startup power (hereinafter referred to as startup voltage) to a first subcircuit which, after startup, is powered by a second subcircuit coupled to and responsive to the first subcircuit. In the description that follows, the terms subcircuit and stage are used interchangeably.

In one embodiment of the invention described in greater detail below, a first stage is powered by the output voltage of a second stage, and an input of the second stage is coupled to the first stage output. Without a startup circuit, it is possible that the second stage, because its output is dependent on parameters in the first stage, may not reach an output level high enough to power the first stage. A startup circuit measures a parameter in the first stage indicative of proper operation of the first stage, and applies a forcing signal to a node within the second stage during startup. This forcing signal causes the output of the second stage to approximate its nominal level. With the output at approximately this nominal level, proper startup and initial operation of the first stage occurs, after which the startup circuit forcing signal is removed and normal operation of the overall circuit begins.

A preferred embodiment of the invention comprises a startup circuit which compares the level of tail current in a differential amplifier in the first stage to a known threshold. Tail current is the combined emitter or source current flowing in a typical differentially-connected transistor pair, and is typically generated by a substantially constant current source coupled to the emitters or sources of such a transistor pair. It is this tail current which is split between the two differentially-connected transistors, approximately equally when the inputs are balanced, and unequally as the input differential voltage or current increases. The threshold is chosen to be at a level such that tail current above the threshold is indicative of proper operation of the first stage. While the tail current is below this threshold, a forcing signal is applied to a suitable node in the second stage, which forces the output of the second stage to a voltage high enough for proper operation of the first stage. When the tail current exceeds the threshold, the forcing voltage is removed and normal circuit operation begins. In many circuits the tail current is more easily measured indirectly as a voltage at the collector or drain of the tail current source. Reference to measurement of tail current, and comparison to a threshold, in this document shall refer to either direct or indirect measurement.

A significant advantage of the described embodiments is the simplicity and reliability of the startup circuit.

DETAILED DESCRIPTION

Figure 1:
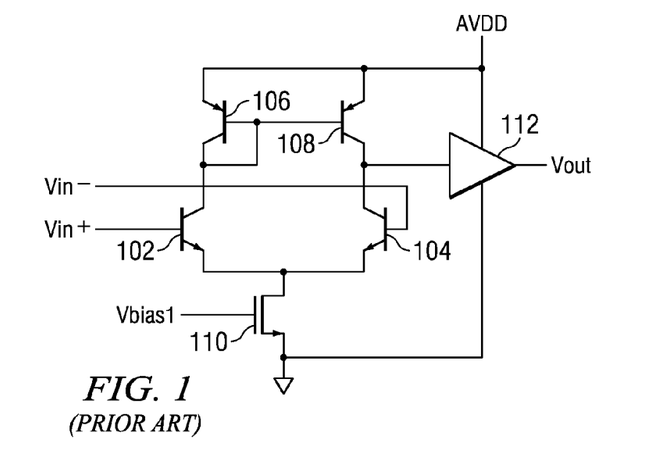
FIG. 1 (prior art) shows a two-stage amplifier having both stages powered by AVDD.

In FIG. 1 (prior art), transistors 102, 104, 106, 108 and 110 are part of a first stage differential amplifier. In a known manner, the positive input terminal Vin+ is coupled to the base of transistor 102, which has its emitter coupled to the emitter of transistor 104 and to the drain of transistor 110. The collector of transistor 102 is coupled to the collector and base of transistor 106, and to the base of transistor 108. The emitter of transistor 106 is coupled to the power supply terminal AVDD. The emitter of transistor 108 is also coupled to terminal AVDD. The negative input terminal Vin− is coupled to the base of transistor 104, which has its collector coupled to the collector of transistor 108 and to the input terminal of the second stage 112. Transistor 110 has its source coupled to ground, and its gate coupled to a bias source terminal Vbias1. Second stage 112 has a positive power supply terminal coupled to AVDD, a negative supply terminal coupled to ground, and an output coupled to output terminal Vout.

In operation and in a known manner, transistor 110 is biased by Vbias1 to cause a tail current Itail to flow in the source and drain lead. With substantially equal voltages at the Vin+ and Vin− terminals, this tail current is split substantially equally between transistor 102 and transistor 104. For the typical case where base currents in the transistors are very small compared to the collector-emitter current flow, substantially the same current flows through transistor 102 and transistor 106. Transistor 106 and transistor 108 are configured as a current mirror, causing whatever current is flowing in transistor 102 (hence in transistor 106) to flow in transistor 108. When the input voltages are substantially equal or balanced, the current flowing from the collector of transistor 108 is substantially equal to the current flow into the collector of transistor 104, and essentially no current flows therefore into or out of the input of the second stage.

When the input voltages become unbalanced, the currents flowing through transistor 102 and transistor 104 also become unbalanced, but the total current flowing in transistor 102 and transistor 104 is substantially the same as in the balanced input condition, due to the action of current source transistor 110. For example, if the unbalanced inputs cause the current in transistor 102 to increase, the current flow from the collector of transistor 106 also increases, and the current mirror causes the current from the collector of transistor 108 to substantially match the increased collector current of transistor 106. Since the total current flow in transistor 102 and transistor 104 is the same as in the balanced input case, the current in transistor 104 decreases. Only a portion of the increased current from transistor 108 collector can therefore flow into transistor 104, and the remainder of the current charges the gate of the second stage input transistor, thus increasing its voltage. In a like manner, unbalancing the inputs in the opposite direction causes current to flow out of the input transistor of the second stage, discharging its gate and decreasing its voltage. A second stage having a bipolar input transistor has a corresponding increase or decrease in base current as the first stage inputs are unbalanced in either direction.

Second stage 112 is a gain stage which further increases the signal level.

Both the first and second stages in this known amplifier are powered by AVDD. Because of the imperfect operation of circuit elements in both stages, fluctuations in the voltage on AVDD are coupled to the output of each stage. Since the first stage has an input signal smaller than that of the second stage, coupling of fluctuations in AVDD to the output of this first stage are typically more damaging to overall performance than coupling from AVDD to circuits in the second stage.

Those skilled in the art will recognize that many types of differential amplifiers are known, using bipolar and MOSFET (metal oxide semiconductor field effect transistor) transistors. Some utilize resistors in place of transistor 106 and/or transistor 108, and differing current source topologies are also widely used. The second stage may also employ MOSFET or bipolar transistors.

Figure 2:
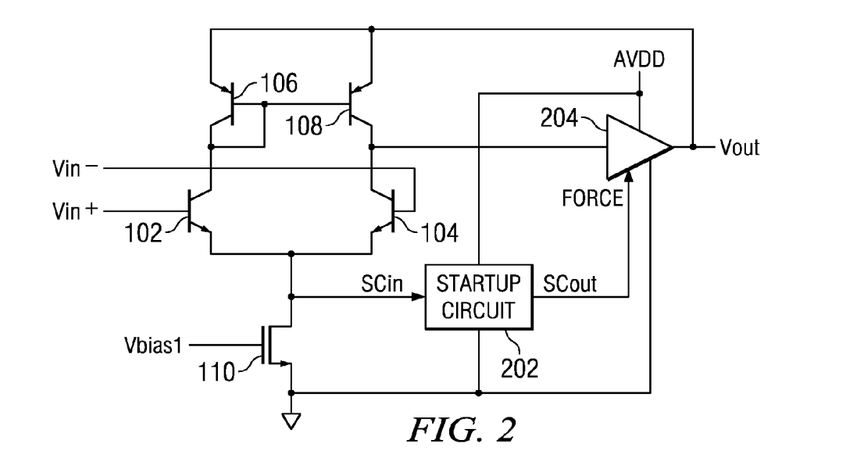
FIG. 2 shows a two-stage amplifier having the first stage powered by the output of the second stage, and having a startup circuit responsive to tail current of the first stage differential amplifier.

In FIG. 2, the two stage amplifier of FIG. 1 is changed to couple the emitters of transistor 106 and transistor 108 to the output terminal Vout of the second stage, rather than to terminal AVDD as in FIG. 1. A startup circuit 202 has an input terminal SCin coupled to the drain of transistor 110, an output terminal SCout coupled to a control input terminal FORCE of second stage 204, a power input terminal coupled to AVDD, and a ground terminal. Second stage 204 has an input terminal and output terminal coupled to the first stage output terminal and to the output terminal Vout respectively, as in FIG. 1. The balance of the circuitry is as described in FIG. 1.

In operation, if Vout is of insufficient level to power the first stage, the total current available from the emitters of transistor 102 and transistor 104 is less than the tail current set by current source transistor 110. The resulting excess current to ground pulls the input of startup circuit 202 low, causing its output SCout to couple a signal of a first state to the FORCE input terminal of second stage 204. This signal of a first state at the FORCE input of second stage 204 is such that the output terminal of this stage is forced to a voltage near its nominal operating voltage. With the nominal operating voltage present at terminal Vout (hence at the power supply input terminals for the first stage), the first stage begins normal operation, causing the voltage on the drain of transistor 110 to rise above the threshold voltage set in startup circuit 202. Once this threshold is crossed, the output of startup circuit 202 changes state, and the second stage is no longer forced to a substantially constant output voltage, but rather begins normal operation.

By powering the first stage with Vout rather than with AVDD, fluctuations in AVDD are substantially isolated from the supply terminal of the first stage by the power supply rejection ratio of the second stage. The overall improvement in PSRR for the combined multi-stage amplifier is significant.

Those skilled in the art will recognize that this topology, which powers a preceding stage by the output of a following stage, is typically best applied to DC amplifier or voltage reference applications, where Vout is, by design, stable and high enough to properly power the preceding stage. However, it will also be apparent that some AC amplifier applications will also benefit from this topology, if the DC component of Vout is suitable for powering the first stage, and if the AC component can be filtered out by passive filtering ahead of the first stage power input.

Figure 3:
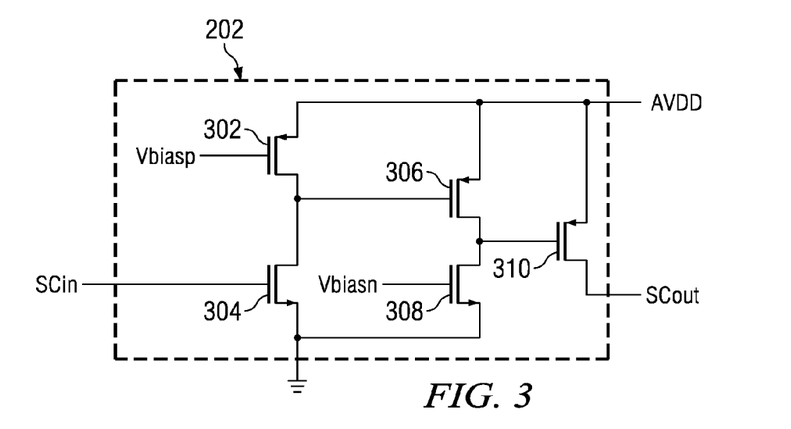
FIG. 3 shows detail of one embodiment of the startup circuit of FIG. 2.

In FIG. 3, one embodiment of the startup circuit 202 has an input terminal SCin coupled to the gate of transistor 304, which has its source grounded and its drain coupled to the drain of transistor 302 and the gate of transistor 306. Transistor 302 has its source coupled to terminal AVDD and its gate coupled to bias source terminal Vbiasp. The source of transistor 306 is coupled to terminal AVDD, while its drain is coupled to the drain of transistor 308 and to the gate of transistor 310. The source of transistor 308 is coupled to ground. The source of transistor 310 is coupled to terminal AVDD, and the drain is coupled to the output terminal SCout.

In operation, during startup, if the input terminal SCin is at a voltage below the gate-source threshold voltage of transistor 304, little or no current flows through transistor 304. Transistor 302 is configured as a current source with current set by the voltage applied to terminal Vbiasp. Since little or no current from transistor 302 flows through transistor 304 or into the gate of transistor 306, the gate of transistor 306 is pulled high (nearly to AVDD), and transistor 306 is cut off. Transistor 308 is configured as a current sink, with the current set by the voltage applied to terminal Vbiasn. When transistor 306 is cut off (little or no current flow), transistor 308 thus pulls the gate of transistor 310 low or near ground, causing transistor 310 to be turned on and causing a voltage near that applied to terminal AVDD to be coupled, with low impedance, to the output terminal SCout.

Conversely, during normal operation of the stage coupled to the input terminal SCin of the startup circuit, the input terminal is at a voltage above the gate-source threshold voltage of transistor 304, so the sink current of transistor 304 exceeds the current from current source transistor 302, pulling the gate of transistor 306 low, thus turning on transistor 306. The source current of transistor 306 then exceeds the sink current of current source transistor 308, causing the gate of transistor 310 to be pulled high and thereby causing transistor 310 to be cut off. The output is then essentially an open drain, substantially decoupled electrically from a circuit connected to the output terminal SCout.

The output signal at terminal SCout, responsive to the state of the stage coupled to the input terminal SCin of the startup circuit, thus provides either a low resistance path to AVDD during the startup time, or a substantially open circuit during normal operation. Such a signal is well suited to forcing an output voltage from the second stage during startup, then having little effect on the second stage after startup.

Those skilled in the art will recognize that many types of threshold detectors are known and will be suited to this invention, and that either a voltage or current threshold may be appropriate. It will also be apparent that many nodes within a circuit controlled by the output of the startup circuit may be suited to control, since the bias points of many nodes within a DC coupled circuit affect the output voltage in a known manner.

Figure 4:
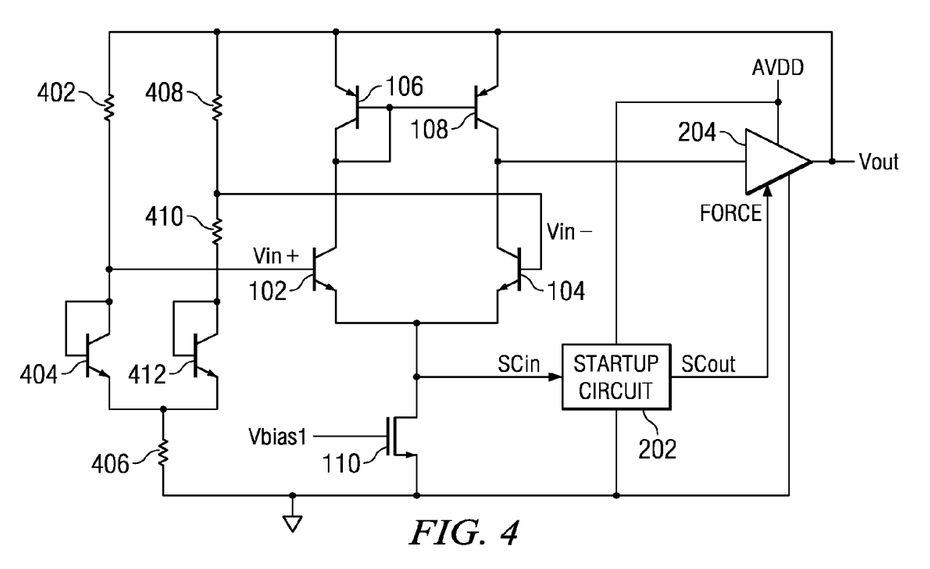
FIG. 4 shows a Brokaw bandgap reference coupled to the two-stage amplifier of FIG. 2 with its first stage powered by the output voltage of the second stage, and having a startup circuit responsive to tail current of the first stage differential amplifier.

In FIG. 4, a preferred embodiment of the invention uses the multi stage amplifier of FIG. 2 as a balance amplifier in a Brokaw bandgap reference circuit. Resistor 402 has a first terminal coupled to Vout at the output of second stage 204, and a second terminal coupled to the collector of transistor 404, the base of transistor 404, and the input terminal Vin+ of the first stage described above. The emitter of transistor 404 is coupled to the emitter of transistor 412 and to a first terminal of resistor 406. The other terminal of resistor 406 is grounded. A first terminal of resistor 408 is coupled to Vout, while the other terminal is coupled to a first terminal of resistor 410 and to the Vin− input terminal of the first stage. The second terminal of resistor 410 is coupled to the base and collector of transistor 412.

In operation, if resistor 402 and resistor 408 are substantially equal, when equal currents flow through both resistors the voltage drops across them are substantially equal. Since the currents flowing into the bases of transistors 102 and 104 are typically negligible, the current in transistor 404 is substantially equal to the current in transistor 412. The junction area of transistor 412 is larger than the junction area of transistor 404, causing a lower current density in transistor 412 than transistor 404. Because of this difference in current density in these transistors, when substantially equal currents flow through them, the voltage drop across the base-emitter junction of the larger junction in transistor 412 is less than the voltage drop across the base-emitter junction of transistor 404. As described in the literature, the theoretical difference in voltage drop is deltaVbe=(kT/q) ln (J1/J2), where J1 and J2 are the current densities of transistor 404 and transistor 412 respectively. This deltaVbe is proportional to absolute temperature, commonly referred to as PTAT. With substantially equal currents in both transistors and substantially equal voltages at the inputs Vin+ and Vin−, the voltage deltaVbe, with PTAT characteristic, appears across resistor 410. The current flowing through resistor 410 thus also has a PTAT characteristic, but with a temperature coefficient significantly less than the negative temperature coefficient of the voltage drop across the base emitter junction of transistor 412. Since negligible current flows into the amplifier inputs, the PTAT current through resistor 410 is substantially the same as the current through resistor 408. The value of resistor 408 is selected such that the PTAT temperature coefficient of the voltage drop across the series combination of resistor 410 and resistor 408 is made substantially the same as the CTAT temperature coefficient of the base emitter junction of transistor 412. The output of the amplifier 204 at terminal Vout is typically thus a reference voltage of approximately 1.2 volts, and this voltage is substantially constant over a wide temperature range due to the summation of PTAT and CTAT temperature characteristics. In a manner as described for FIG. 2, this output voltage is used to power the first amplifier stage.

Figure 5:
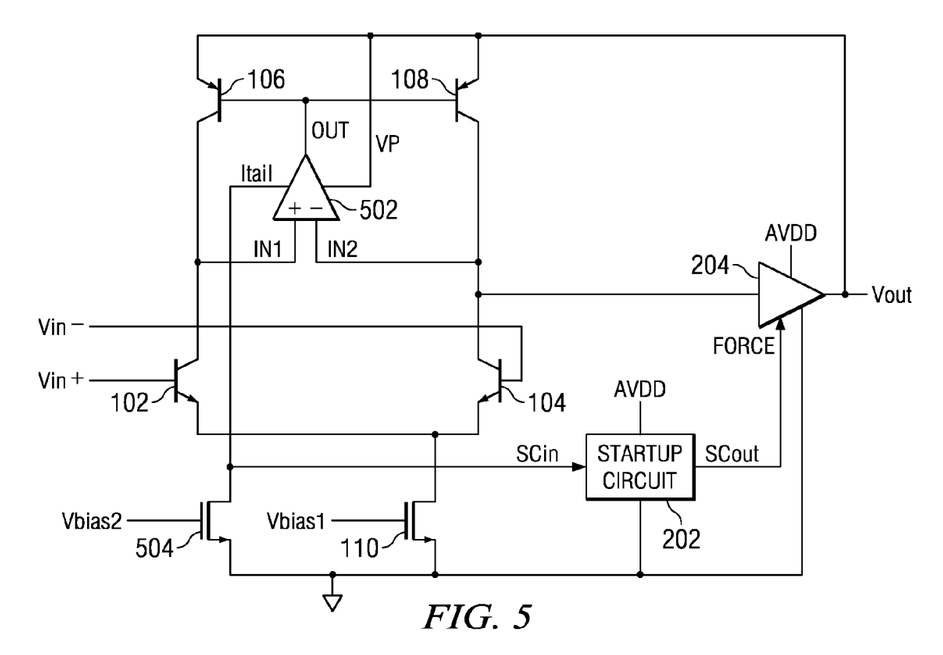
FIG. 5 shows a two-stage amplifier of FIG. 2 having a current mirror gain boost amplifier in the first stage, and having a startup circuit responsive to the tail current of the current mirror gain boost amplifier.

In FIG. 5, the first stage of the amplifier of FIG. 2 is modified to add a current mirror gain boost amplifier 502 and a current source 504 providing tail current for amplifier 502. Amplifier 502 has a first input terminal IN1 coupled to the collector of transistor 106 and the collector of transistor 102; a second input terminal IN2 coupled to the collector of transistor 108, the collector of transistor 104, and the input of amplifier 204; an output terminal OUT coupled to the bases of both transistor 106 and transistor 108; a supply terminal VP coupled to the output terminal Vout of second stage amplifier 204; and a tail current terminal Itail coupled to the drain of current source 504 and the input terminal SCin of startup circuit 202. Current source 504 has a drain coupled to the tail current terminal Itail of amplifier 502 and the input terminal SCin of startup circuit 202 as described, a gate coupled to a bias generator terminal Vbias2, and a source coupled to ground. Startup circuit 202 has an input terminal SCin coupled as described, a power supply terminal coupled to terminal AVDD, a ground terminal coupled to ground, and an output terminal SCout coupled to the FORCE input terminal of amplifier 204.

In operation, the circuitry other than the added amplifier 502, current source 504 and startup circuit 202 operate as described for the current source comprising transistor 110 and startup circuit 202 of FIG. 2. In a known manner amplifier 502 and its tail current source 504 increase the gain of the first stage amplifier. As in the embodiment described in FIG. 2, the first stage amplifier is powered by the output of the second stage amplifier. If the output voltage of the second stage is too low to properly power the first stage, the tail current provided by current source 504 is below the threshold set in startup circuit 202, and the output SCout of startup circuit 202 is in a state which forces the output of amplifier 204 to a voltage high enough to power the first stage. The tail current provided by current source transistor 504 then rises to its nominal value, causing the voltage at the drain of transistor 504 to rise above the threshold in startup circuit 202, and the output SCout of startup circuit 202 changes state to remove the forcing signal from amplifier 204. With this forcing signal removed and with the output voltage of amplifier 204 high enough to power the first stage, normal operation of the overall circuit occurs.

Figure 6:
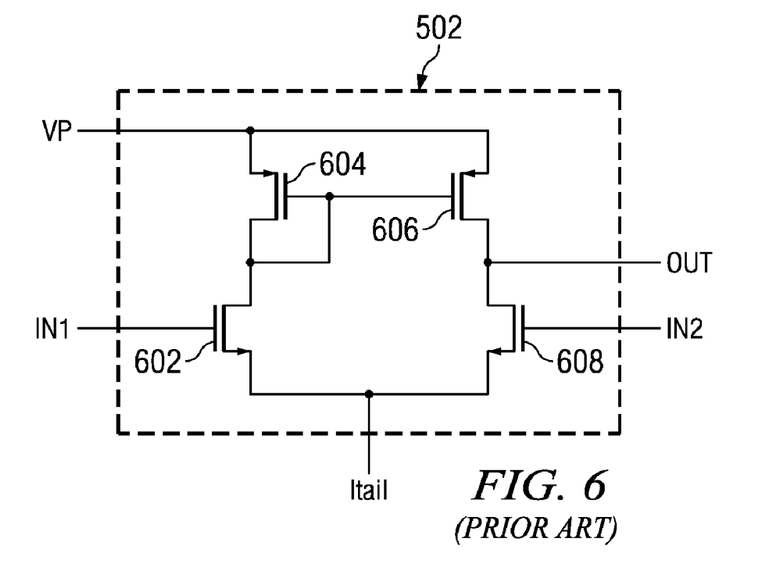
FIG. 6 (prior art) shows additional circuit detail of the current mirror gain boost amplifier.

In FIG. 6 (prior art), the circuit detail of a typical current mirror gain boost amplifier 502 is shown. Transistor 604 has a source coupled to a power terminal VP and to the source of transistor 606. The gate of transistor 604 is coupled to the drain of transistor 604, the drain of transistor 602, and the gate of transistor 606. The source of transistor 602 is coupled to terminal Itail and to the source of transistor 608. The drain of transistor 606 is coupled to the OUT terminal and to the drain of transistor 608. The gate of transistor 602 is coupled to input terminal IN1, while the gate of transistor 608 is coupled to input terminal IN2.

In operation and in a known manner, transistor 604 and transistor 606 act as a current mirror, while transistor 602 and transistor 608 is a differentially-connected pair having differential voltage inputs at their respective gates. Current Itail is provided by a current source such as current source 504 of FIG. 5. Terminal VP is the power terminal for amplifier 502, and is typically coupled to AVDD in the prior art, or to the output of the second stage as shown in FIG. 5 in an embodiment of the invention.

Figure 7:
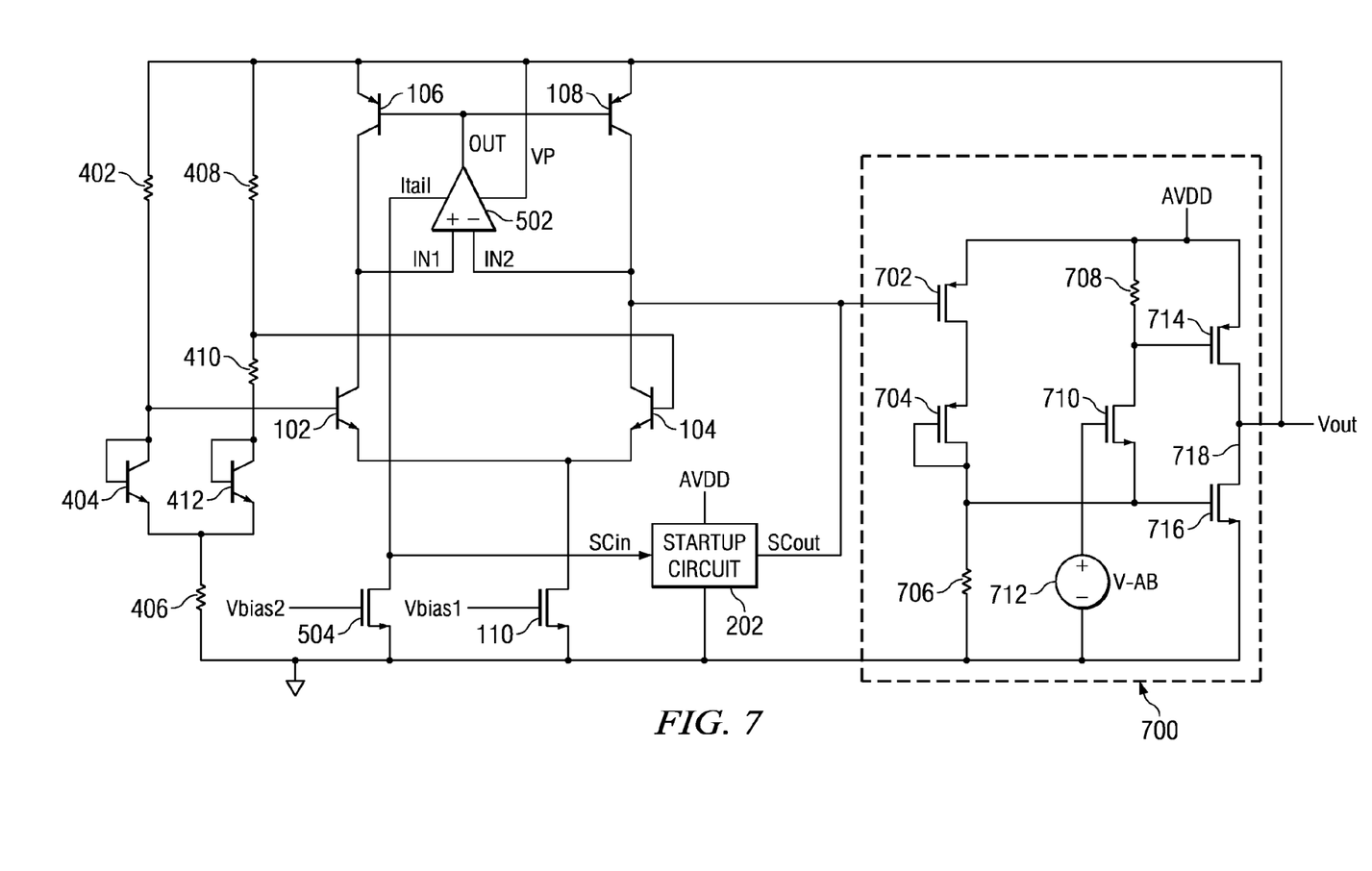
FIG. 7 shows another embodiment of the invention, combining the circuit of FIG. 5 with a Brokaw bandgap circuit and a one-sided Monticelli class A/B output stage.

FIG. 7 shows schematically yet another embodiment of the invention, which is a voltage reference generator in which the second stage amplifier 700 comprises five transistors configured in a known manner as a gain stage with class AB output driver. In this embodiment, amplifier 700 replaces the generic amplifier 204 previously described. Also shown in FIG. 7 is the Brokaw bandgap reference generator described in FIG. 4 and the current mirror gain boost amplifier 502 described in FIG. 5 and FIG. 6, with the combined circuitry having an overall configuration of Brokaw bandgap followed by and coupled to a two stage amplifier, and wherein the first amplifier stage is coupled to and powered by the output terminal voltage from the second amplifier stage. The topology and interconnection of elements of the circuitry preceding the input of amplifier 700 is the same as has been described in prior figures.

Transistor 702 has a source coupled to terminal AVDD, a gate coupled to the output terminal of the first stage amplifier and to the output terminal SCout of startup circuit 202, and a drain coupled to the source of transistor 704. Transistor 704 has a gate coupled the drain of transistor 704, a first terminal of resistor 706, the source of transistor 710, and the gate of transistor 716. The second terminal of resistor 706 is coupled to ground. The gate of transistor 710 is coupled to a first terminal of bias voltage generator V-AB 712. The second terminal of bias voltage generator V-AB 712 is coupled to ground. The drain of transistor 710 is coupled to a first terminal of resistor 708 and to the gate of transistor 714. The second terminal of resistor 708 is coupled to terminal AVDD. The source of transistor 714 is coupled to terminal AVDD, while the drain of transistor 714 is coupled to the drain of transistor 716 and to the output terminal Vout 718. Output terminal Vout 718 is also coupled to the first stage amplifier and to the Brokaw bandgap cell as described earlier. The source of transistor 716 is coupled to ground.

In operation and in a known manner, transistors 702 and 704 in conjunction with resistor 706 provide a single-ended gain stage with an input at the gate of transistor 702 and an output at the drain of transistor 704. This output voltage is coupled to the gate of transistor 716, which acts as the current sink of the class AB output stage comprising transistor 716 and transistor 714. The output signal from the single-ended gain stage is also coupled through transistor 710 to the gate of transistor 714, which acts as the current source in the class AB pair. For a given voltage at the drain of transistor 704, bias source V-AB controls the relative amounts of current caused to flow in transistor 714 and transistor 716, thereby controlling the crossover region where the class AB output pair transitions between sourcing and sinking current. The output of the class AB stage is taken from the output terminal Vout 718 coupled as described to the drains of transistor 714 and transistor 716.

In the topology of FIG. 7, the input to the second stage amplifier is also used as the FORCE input terminal. When the SCout terminal signal is high, indicative of inadequate tail current in the first stage amplifier, this high signal forces the output of the second stage amplifier to near its maximum. When the current source in the first stage has nominal tail current, terminal SCout goes to an open-drain state, effectively removing the effect of startup circuit 202 on the second stage amplifier. Those skilled in the art will recognize that many different forcing nodes are available in a typical DC-coupled amplifier such as the second stage shown here.

The overall circuit of the preferred embodiment of the invention shown in FIG. 7 thus has a Brokaw reference core followed by a first and second gain stage, with the output of the second amplifier stage coupled to the Brokaw core as well as, in the novel manner described, to the power supply terminal of the first amplifier stage. The resulting voltage powering the first amplifier stage is therefore quieter than the voltage at terminal AVDD and only minimally influenced by changes in the voltage at terminal AVDD, leading to significant improvement in PSRR of the overall reference voltage generator circuit.

Figure 8:
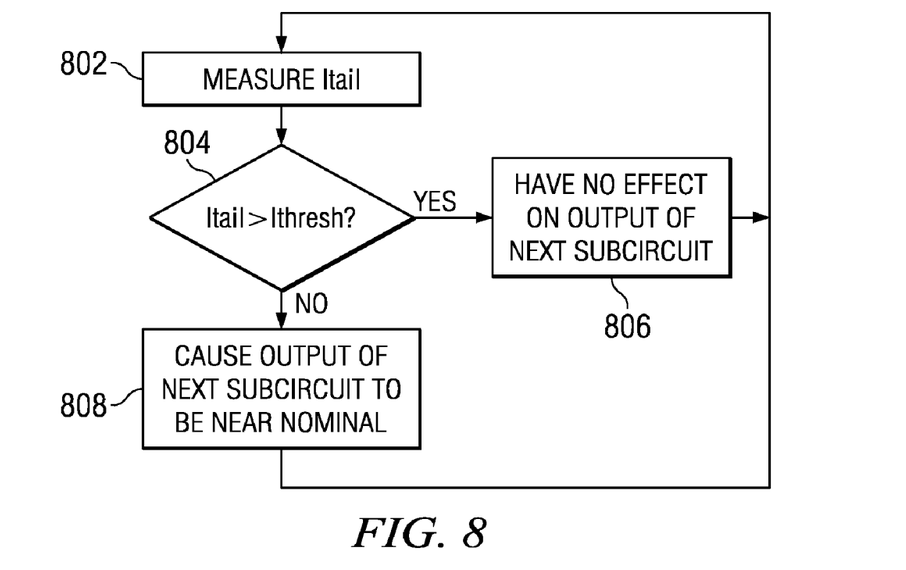
FIG. 8 is a flow chart for the method of modifying the output of a next subcircuit, which has an input coupled to a prior subcircuit, dependent on the tail current measured in a prior subcircuit Throughout the drawings, like elements are referred to by like numerals.

FIG. 8 is a flow chart showing a preferred method of modifying the output voltage of a next subcircuit dependent on the level of tail current measured in a first subcircuit, wherein the output of the first subcircuit is coupled to the input of the next subcircuit, and wherein the output of the next subcircuit provides power for the first sub circuit.

At step 802, the tail current of a differential amplifier within the first subcircuit is measured. At step 804, the measured tail current is compared using known electronic comparator circuits to a threshold current Ithresh, at or above which normal operation of the first subcircuit occurs. At step 806, reached if the comparison indicates the tail current is above the threshold current, the control output of the first subcircuit, coupled to the control input of the next subcircuit, causes substantially no change in the operation or output voltage of the second subcircuit. At step 808, reached if the comparison shows the tail current to be below the threshold current, the control output of the first subcircuit, coupled to the control input of the next subcircuit, causes the output voltage of the second subcircuit to substantially equal its nominal output voltage regardless of the level of the input voltage to the next subcircuit.

It is therefore apparent that during startup, when the tail current is lower than that threshold level indicative of proper operation, the output of the next subcircuit is forced to its nominal output level, thereby providing a power supply voltage to the first subcircuit sufficient to allow proper operation and hence nominal tail current. When the measured tail current then rises above the threshold, the forcing signal is removed, allowing the next subcircuit to operate normally. In this manner, startup of the overall circuit is enhanced.

Those skilled in the art to which the invention relates will appreciate that yet other substitutions and modifications can be made to the described embodiments, without departing from the spirit and scope of the invention as described by the claims below. For example, many alternative amplifier configurations for the first stage are known, which utilize a current source wherein the level of current flow in the current source is indicative of proper operation of the first stage amplifier, and which can be compared to a threshold in a startup circuit. Many ways of forcing the output of a second or subsequent stage to approximately its nominal output level are also known. While a two-stage amplifier has been described in the embodiments above, those skilled in the art will recognize that differing numbers of stages may be used, while still employing the novel startup mechanism disclosed herein. Where field effect transistors have been described in portions of the circuitry, they may be replaced by bipolar transistors; similarly, bipolar transistors may be replaced with field effect transistors. The threshold detection circuit described in FIG. 3 may be replaced with other known threshold circuits. While the terms first and next subcircuits have been used, many other topologies wherein any prior subcircuit is coupled to and dependent for power on any subsequent subcircuit will also be apparent to those skilled in the art.

Many other alternatives to the circuits and sub circuits described are possible while retaining the scope and spirit of the invention.

What is claimed is:

1. An apparatus for providing a startup voltage for a first subcircuit, comprising:
   a first subcircuit having a current sink for sinking a predetermined constant current during normal operation of said first subcircuit, and adapted to conduct an operating current drawn from a power supply terminal thereof;
   a second subcircuit having a control node, an output terminal coupled to the power supply terminal of said first subcircuit, an input terminal coupled to an output terminal of said first subcircuit, and having an output voltage responsive to the second subcircuit input signal;
   a comparison circuit responsive to the level of said operating current, having an input node coupled to said current sink and having an output node coupled to said control node, said comparison circuit having a first output state if the level of said operating current is below the level of said predetermined constant current, and having a second state if the level of said operating current is above the level of said predetermined constant current;
   whereby, in response to said first output state of said comparison circuit, the output voltage of said second subcircuit is driven to rise to a level high enough to provide an operating voltage for said first subcircuit, and whereby, in response to said second output state of said comparison circuit, the output voltage of said second subcircuit is independent of the output state of said comparison circuit, thus allowing normal operation of the overall circuit beyond the startup time period.

2. An apparatus for providing a startup voltage for a first subcircuit, comprising:
   a first subcircuit adapted to conduct an operating current drawn from a power supply terminal thereof;
   a second subcircuit having a control node, an output terminal coupled to the power supply terminal of said first subcircuit, an input terminal coupled to an output terminal of said first subcircuit, and having an output voltage responsive to the second subcircuit input signal;
   a comparison circuit responsive to the level of said operating current, having an input node coupled a current source and having an output node coupled to said control node, said comparison circuit having a first output state if the level of said operating current is below a predetermined level, and having a second state if the level of said operating current is above said predetermined level;
   whereby, in response to said first output state of said comparison circuit, the output voltage of said second subcircuit is driven to rise to a level high enough to provide an operating voltage for said first subcircuit, and whereby, in response to said second output state of said comparison circuit, the output voltage of said second subcircuit is independent of a level of the output state of said comparison circuit, thus allowing normal operation of the overall circuit beyond the startup time period.

3. An apparatus for providing a startup voltage for a first subcircuit, which said first subcircuit receives an operating voltage from the output of a next subcircuit, and wherein an output of said first subcircuit is coupled to an input of said next subcircuit, thereby causing the output voltage of said next subcircuit to be dependent on operation of said first subcircuit, comprising:
   a first subcircuit having a current source providing a substantially constant current of nominal level during normal operation of said first subcircuit;
   a next subcircuit having a control node, an output coupled to a power supply terminal of said first subcircuit, an input terminal coupled to an output terminal of said first subcircuit, and having an output voltage responsive to the next subcircuit input signal and to the state of a signal applied to said control node;
   a comparison circuit responsive to the level of said substantially constant current, having an input coupled to a node in said current source and having an output coupled to said control node of said next subcircuit, said comparison circuit having a first output state if the level of said current is at a substantially nominal level, and having a second state if the level of said current is not at said substantially nominal level;
   whereby said first output state of said comparison circuit, indicative of being in a startup time period and being coupled to said control node of said next subcircuit, substantially forces the output voltage of said next subcircuit to a level high enough to provide nominal operating voltage for said first subcircuit, and whereby said second output state of said comparison circuit, indicative of being past the startup time period, has substantially no effect on the operation of said next subcircuit, thus allowing normal operation of the overall circuit beyond the startup time period.

4. The apparatus of claim 3, wherein:
said first subcircuit comprises a differential amplifier having a first positive input and a second negative input;
said current source provides the tail current for said differential amplifier; and
said second subcircuit comprises an amplifier.

5. The apparatus of claim 3, wherein said comparison circuit comprises:
a first transistor, having a gate coupled to said node in said current source, a source coupled to a ground terminal, and a drain;
a second transistor having a drain coupled to the drain of said first transistor, a gate, and a source coupled to a supply voltage terminal;
a third transistor having a gate coupled to said drains of said first and said second transistors, a source coupled to said supply voltage terminal, and a drain;
a fourth transistor having a drain coupled to said drain of said third transistor, a gate, and a source coupled to said ground terminal;
a fifth transistor having a gate coupled to said drains of said third and said fourth transistors, a source coupled to said supply voltage terminal, and a drain coupled to said control node of said next subcircuit;
a first bias source coupled to said gate of said second transistor;
a second bias source coupled to said gate of said fourth transistor;
whereby if the voltage at said gate of said first transistor is below a level substantially set by the threshold voltage of said first transistor, said fifth transistor will be turned on causing a low impedance coupling between said power supply terminal and said control input, further causing the output of said next subcircuit to be at a substantially high level;
and further whereby if the voltage at said gate of said first transistor is above a level substantially set by the threshold voltage of said first transistor, said fifth transistor will be turned off causing a high impedance coupling between said power supply voltage terminal and said control input, further causing little or no effect on the output voltage of said next subcircuit.

6. The apparatus of claim 4, further comprising:
a Brokaw bandgap core circuit having an input coupled to said output of said next amplifier, having a first output coupled to said positive input of said differential amplifier, and having a second output coupled to said negative input of said differential amplifier.

7. The apparatus of claim 4, wherein said first amplifier further comprises;
a differential amplifier with current mirror;
a current mirror gain boost amplifier coupled to said current mirror;
a second current source coupled to the tail current terminal of said current mirror gain boost amplifier;
a coupling between a node in said second current source and said comparison circuit;
whereby the output state of said comparison circuit, responsive to the level of current in said second current source, is indicative of being within or beyond the startup time period.

8. The apparatus of claim 4, wherein further said next amplifier comprises a class AB amplifier.

9. A method for providing an initial operating voltage for a first subcircuit which receives its nominal operating voltage from the output of a next subcircuit, wherein the output of said first subcircuit is coupled to the input of said second subcircuit, comprising the steps:
i.) measuring, with a suitable known electronic circuit, the level of tail current Itail of a current source coupled to a first amplifier within said first subcircuit;
ii) comparing, using a known electronic comparison circuit, said level of tail current Itail with a threshold value;
iii.) coupling a first signal to a control node in said next subcircuit if said current Itail is below said threshold value, whereby said first signal causes the output voltage of said next subcircuit to be substantially at its nominal value;
iv.) coupling a second signal to said control node in said next subcircuit if said current Itail is above said threshold value, whereby said second signal has substantially no effect on the output voltage of said second subcircuit;
whereby the output of said next subcircuit is forced to a substantially nominal voltage level sufficient to power said first subcircuit when said comparing step finds said current Itail to be below said threshold, and whereby said comparing step has substantially no effect on the output voltage of said next subcircuit if said comparing step finds said current Itail to be above said threshold.

* * * * *